(12) United States Patent
Kim

(10) Patent No.: US 7,839,688 B2
(45) Date of Patent: *Nov. 23, 2010

(54) FLASH MEMORY DEVICE WITH IMPROVED PROGRAMMING OPERATION VOLTAGES

(75) Inventor: Moo-Sung Kim, Yongin-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/110,624

(22) Filed: Apr. 28, 2008

(65) Prior Publication Data

US 2008/0198663 A1     Aug. 21, 2008

Related U.S. Application Data

(63) Continuation of application No. 11/264,708, filed on Nov. 1, 2005, now Pat. No. 7,376,017.

(30) Foreign Application Priority Data

May 2, 2005     (KR)     ............................ 2005-0036784

(51) Int. Cl.
    *G11C 16/04*     (2006.01)
(52) U.S. Cl. ............................ 365/185.18; 365/185.23; 365/185.25
(58) Field of Classification Search ............ 365/185.23, 365/185.18, 185.25
See application file for complete search history.

(56) References Cited

U.S. PATENT DOCUMENTS

| | | | |
|---|---|---|---|
| 5,673,223 A | 9/1997 | Park | |
| 5,677,873 A | 10/1997 | Choi et al. | |
| 5,715,194 A | 2/1998 | Hu | |
| 5,991,202 A | 11/1999 | Derhacobian et al. | |
| 6,061,270 A | 5/2000 | Choi | |
| 6,483,357 B2 | 11/2002 | Kato et al. | |
| 6,487,120 B2 * | 11/2002 | Tanzawa et al. | ......... 365/185.18 |
| 6,614,688 B2 * | 9/2003 | Jeong et al. | ............ 365/185.18 |
| 6,967,524 B2 | 11/2005 | Saiki et al. | |
| 7,161,833 B2 * | 1/2007 | Hemink | .................. 365/185.18 |
| 7,376,017 B2 * | 5/2008 | Kim | ...................... 365/185.23 |

(Continued)

FOREIGN PATENT DOCUMENTS

JP     2000-243094     *     8/2000

(Continued)

*Primary Examiner*—Hoai V Ho
*Assistant Examiner*—Kretelia Graham
(74) *Attorney, Agent, or Firm*—Muir Patent Consulting, PLLC

(57)     ABSTRACT

A flash memory device which comprises a memory cell array having memory cells arranged in rows and columns; a word line voltage generator circuit configured to generate a program voltage, a dielectric breakdown prevention voltage, and a pass voltage at a program operation; and a row selector circuit that receives the program voltage, the dielectric breakdown prevention voltage, and the pass voltage and selecting one of the rows in response to a row address. The dielectric breakdown prevention voltage is lower than the program voltage and higher than the pass voltage; and the row selector circuit drives the selected row with the program voltage, drives at least one row just adjacent to, or neighboring, the selected row with the dielectric breakdown prevention voltage and drives remaining rows with the pass voltage.

13 Claims, 9 Drawing Sheets

U.S. PATENT DOCUMENTS

| | | | |
|---|---|---|---|
| 2002/0191443 A1* | 12/2002 | Lee et al. | 365/185.18 |
| 2004/0080980 A1* | 4/2004 | Lee | 365/185.17 |
| 2005/0168263 A1 | 8/2005 | Fukuda et al. | |

FOREIGN PATENT DOCUMENTS

| | | |
|---|---|---|
| JP | 2000243094 | 9/2000 |
| JP | 2004014052 | 1/2004 |
| KR | 10-2004-0036015 | 4/2004 |

* cited by examiner (Vref1 ≠ Vref2 ≠ Vref3)

($V_{pass} < V_{DBP} < V_{pgm}$)

FLASH MEMORY DEVICE WITH IMPROVED PROGRAMMING OPERATION VOLTAGES

CROSS-REFERENCE TO RELATED APPLICATIONS

This application is a continuation of U.S. application Ser. No. 11/264,708, filed on Nov. 1, 2005, which relies for priority upon Korean Patent Application No. 2005-36784 filed on May 2, 2005, the contents of which are hereby incorporated by reference.

FIELD OF THE INVENTION

The present invention is related to a semiconductor memory device. In particular, the present invention is related to a flash memory device and a program method.

BACKGROUND OF THE INVENTION

A flash memory device known as a flash EEPROM, in general, includes a memory cell array of memory cells each of which consists of a floating gate transistor. The memory cell array includes strings (or NAND strings) of floating gate transistors. In each string, the floating gate transistors are connected in series between a string select transistor and a ground select transistor. A plurality of word lines are arranged to intersect NAND strings and are connected to corresponding floating gate transistors of each NAND string, respectively.

Floating gate transistors, that is, memory cells, are erased to have a threshold voltage (e.g., −1V to −3V) that is lower than 0V. In order to program a selected memory cell, a high voltage (e.g., 20V) is applied to a word line of the selected memory cell during a given period of time. This causes the threshold voltage of the selected memory cell to shift into a higher level. During a program operation, the threshold voltages of unselected memory cells are not changed.

A problem arises when memory cells connected to a common word line are programmed. When a program voltage is applied to a word line, it is applied not only to selected memory cells but also to unselected memory cells. The selected and unselected memory cells are connected to the same word line. In this bias condition, the unselected memory cells connected to the word line can become programmed. Unintended programming of unselected memory cells is referred to as "program disturb".

One of the techniques for preventing a program disturb phenomenon is a program inhibiting method referred to as a self-boosting scheme. The program inhibiting method using the self-boosting scheme is disclosed in U.S. Pat. No. 5,677,873 entitled "METHOD OF PROGRAMMING FLASH EEPROM INTEGRATED CIRCUIT MEMORY DEVICES TO PREVENT INADVERTENT PROGRAMMING OF NONDESIGNATED NAND MEMORY CELLS THEREIN" and U.S. Pat. No. 5,991,202 entitled "METHOD FOR REDUCING PROGRAM DISTURB DURING SELF-BOOSTING IN A NAND FLASH MEMORY", which are incorporated herein by reference.

In the program inhibiting method using the self-boosting scheme, a ground path is shut off by applying a voltage of 0V to a gate of a ground select transistor. A voltage of 0V is applied to a selected bit line, and a power supply voltage as a program inhibition voltage is applied to an unselected bit line. At the same time, a voltage (a power supply voltage or a voltage lower than the power supply voltage) is applied to a gate of a string select transistor. This causes the source of the string select transistor to be charged up to a voltage of (Vcc-Vth) (where Vth is the threshold voltage of the string select transistor). At this time, the string select transistor is shut off. A channel voltage of a program-inhibited cell transistor is boosted by applying a program voltage Vpgm to a selected word line and a pass voltage Vpass to unselected word lines. The pass voltage Vpass is higher than a power supply voltage and lower than the program voltage Vpgm. With these bias conditions, F-N tunneling does not occur between the floating gate and the channel. Accordingly, the program-inhibited cell transistor is maintained in an erased state.

Another technique for preventing the program disturb is a program inhibiting method using a local self-booting technique. The program inhibiting method using the local self-booting technique is disclosed in U.S. Pat. No. 5,715,194 entitled "BIAS SCHEME OF PROGRAM INHIBIT FOR RANDOM PROGRAMMING IN A NAND FLASH MEMORY" and U.S. Pat. No. 6,061,270 entitled "METHOD FOR PROGRAMMING A NON-VOLATILE MEMORY DEVICE WITH PROGRAM DISTURB CONTROL", which are incorporated herein by reference.

In the program inhibiting method using the local self-boosting scheme, a voltage of 0V is applied to two unselected word lines adjacent to a selected word line. After a pass voltage Vpass is applied to remaining unselected word lines, a program voltage Vpgm is applied to a selected word line. By this biasing scheme, a channel of a local self-boosted cell transistor is limited to a selected word line, and a channel boosting voltage of a program-inhibited cell transistor is increased as compared with the program inhibiting method using the self-boosting scheme. Therefore, no F-N tunneling arises between a floating gate of the program-inhibited cell transistor and a channel, so that the program-inhibited cell transistor is retained in an erased state. In the local self-boosting scheme, a voltage of 0V can be applied to either one of two unselected word lines adjacent to a selected word line.

The above-described program methods have associated with them the following problem. As the degree of integration of a flash memory device is gradually increased, the interval between word lines narrows. Although the interval between word lines narrows, voltages to word lines are not varied. In other words, although the interval between word lines narrows, a program voltage applied to a selected word line and a pass voltage applied to unselected word lines are maintained without variation. For this reason, as the interval between word lines increasingly narrows, the dielectric layer between a selected word line and an unselected word line can become broken down due to a high voltage difference between word lines. For example, in the case that an interval between word lines is about 30 micrometers, if a high voltage (e.g., above 10V) is applied between a selected word line supplied with a program voltage and an unselected word line supplied with a pass voltage, a dielectric layer between the word lines can become broken down. This causes the pass and program voltages to be changed during a program operation. Accordingly, the reliability of the flash memory device is lowered.

SUMMARY OF THE INVENTION

The invention is to provide a flash memory device and a program method capable of improving the reliability of a flash memory device.

In one aspect, the present invention is directed to a flash memory device comprising a memory cell array having memory cells arranged in rows and columns; a word line voltage generator circuit configured to generate a program voltage, a dielectric breakdown prevention voltage, and a pass voltage during a program operation; and a row selector circuit that receives the program voltage, the dielectric breakdown prevention voltage, and the pass voltage and selecting one of the rows in response to a row address, wherein the dielectric breakdown prevention voltage is lower than the program voltage and higher than the pass voltage; and the row selector circuit drives the selected row with the program voltage, drives at least one row adjacent, or neighboring, the selected row with the dielectric breakdown prevention voltage and drives remaining rows with the pass voltage.

In one embodiment, the word line voltage generator circuit comprises a first voltage generator that receives a power supply voltage to generate the program voltage; a second voltage generator that receives the power supply voltage to generate the dielectric breakdown prevention voltage; and a third voltage generator that receives the power supply voltage to generate the pass voltage.

In another embodiment, each of the first, second and third voltage generators comprises an oscillator that generates an oscillation signal; a regulator that receives the oscillation signal to output a clock signal synchronized with the oscillation signal according to whether a corresponding output voltage is lower than a reference voltage; and a pump that receives the power supply voltage to generate the corresponding output voltage based on the clock signal.

In another embodiment, the word line voltage generator circuit comprises a first voltage generator that receives a power supply voltage to generate the program voltage; a second voltage generator that receives the power supply voltage to generate the dielectric breakdown prevention voltage; and a regulator that receives the dielectric breakdown prevention voltage to generate the pass voltage.

In another embodiment, each of the first and second voltage generators comprises an oscillator that generates an oscillation signal; a regulator that receives the oscillation signal to output a clock signal synchronized with the oscillation signal according to whether a corresponding output voltage is lower than a reference voltage; and a pump that receives the power supply voltage to generate the corresponding output voltage based on the clock signal.

In another embodiment, the regulator comprises a plurality of MOS transistors connected in series between the dielectric breakdown prevention voltage and the pass voltage; and a plurality of switches each corresponding to the MOS transistors, each of the switches connected in parallel with a corresponding MOS transistor.

In another embodiment, the memory device further comprises a page buffer circuit for storing data to be programmed, the page buffer circuit setting up each of the columns with either one of a first bit line voltage and a second bit line voltage.

In another embodiment, before the program voltage is supplied to the selected row, either one of the dielectric breakdown prevention voltage and the pass voltage is supplied to the selected row for a time period.

In another aspect, the present invention is directed to a program method of a flash memory device which has an array of memory cells arranged in rows and columns. The program method comprises applying a program voltage to a selected one of the rows; applying a dielectric breakdown prevention voltage to at least one row adjacent, or neighboring, the selected row, the dielectric breakdown prevention voltage being lower than the program voltage; and applying a pass voltage lower than the dielectric breakdown prevention voltage to remaining rows.

In one embodiment, the method further comprises setting up each of the columns with either one of a first bit line voltage and a second bit line voltage.

In another embodiment, the first bit line voltage is a ground voltage and the second bit line voltage is a power supply voltage.

In another embodiment, the method further comprises supplying either one of the dielectric breakdown prevention voltage and the pass voltage to the selected row during a predetermined time, before the program voltage is supplied to the selected row.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DESCRIPTION OF EMBODIMENTS OF THE INVENTION

The preferred embodiment of the invention will be more fully described with reference to the attached drawings.

Figure 1:
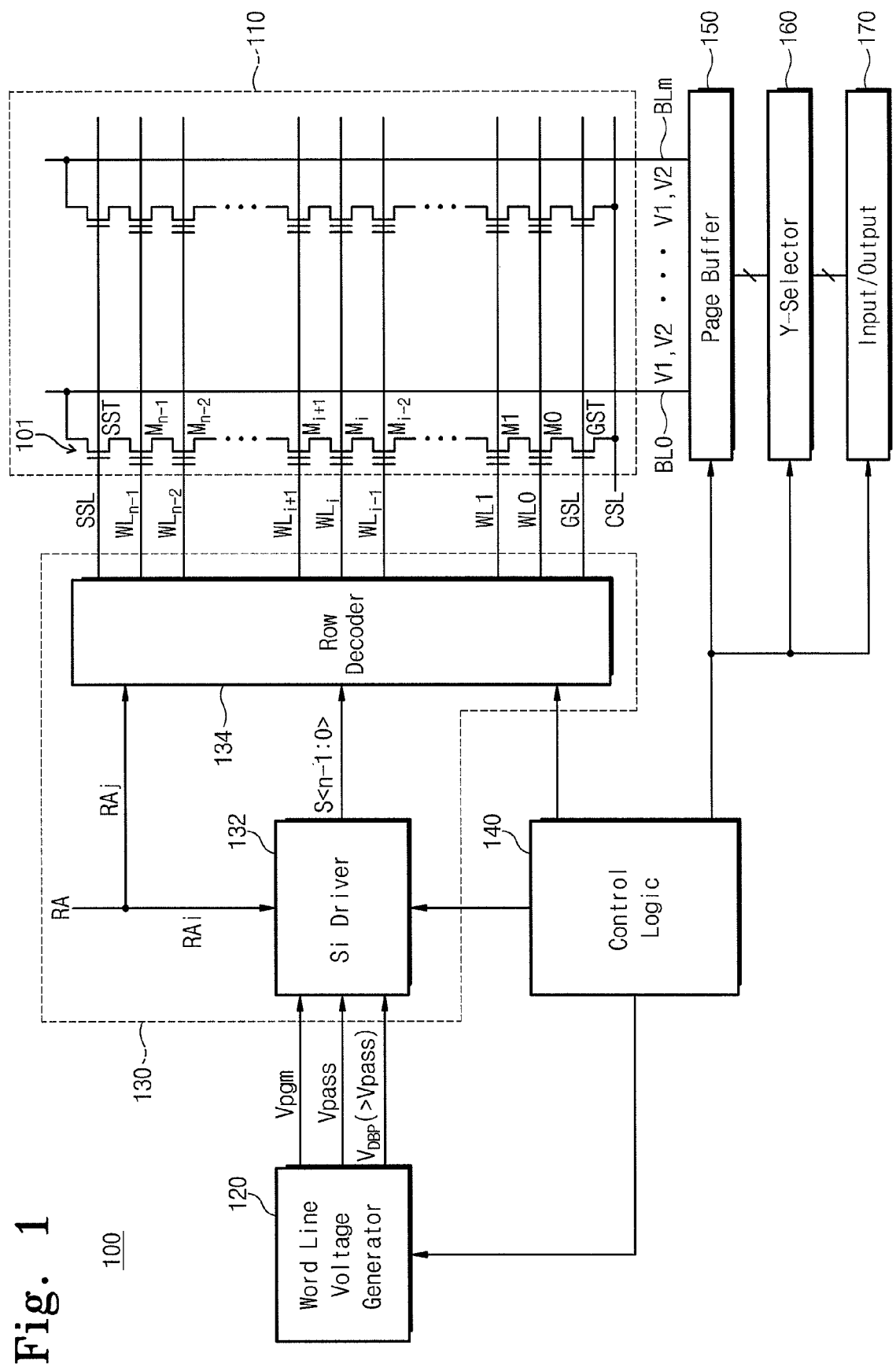
FIG. 1 is a block diagram of a flash memory device according to the present invention.

FIG. 1 is a block diagram of a flash memory device according to the present invention.

Referring to FIG. 1, the present flash memory device 100 comprises a memory cell array 110 consisting of a plurality of memory blocks. The memory cell array 110 in FIG. 1 corresponds to one memory block, and remaining memory blocks are configured the same as illustrated in FIG. 1. The memory cell array 110 comprises a plurality of cell strings 101 corresponding to bit lines BL0 to BLm, respectively. Each of the cell strings 101 has a corresponding string select transistor SST as a first select transistor, a ground select transistor GST as a second select transistor, and a plurality of flash EEPROM cells M0 to Mn-1 connected in series between the select transistors SST and GST. The string select transistor SST has a drain connected to a corresponding bit line and a gate connected to a string select line SSL, and the ground select transistor GST has a source connected to a common source line CSL and a gate connected to a ground select line GSL. The flash EEPROM cells Mn-1 to M0 are connected in series between a source of the string select transistor SST and a drain of the ground select transistor GSL, and their gates are connected to corresponding word lines WLn−1 to WL0, respectively.

Continuing to referring to FIG. 1, the flash memory device 100 according to the present invention further comprises a word line voltage generator circuit 120, a row selector circuit 130 as a row selector circuit, control logic 140, a page buffer circuit 150, a column selector circuit 160, and an input/output buffer circuit 170.

The word line voltage generator circuit 120 is controlled by the control logic 140 and generates a program voltage Vpgm, a pass voltage Vpass, and a dielectric breakdown prevention voltage $V_{DBP}$ as word line voltages at a program operation. Herein, the dielectric breakdown prevention voltage $V_{DBP}$ is higher than the pass voltage Vpass and is lower than the program voltage Vpgm. The row selector circuit 130 supplies word line voltages to word lines WL0 to WLn−1 under the control of the control logic 140, respectively. For example, the row selector circuit 130 is supplied with the word line voltages Vpgm, Vpass and $V_{DBP}$ from the word line voltage generator circuit 120 during a program operation, and selects one of the word lines WL0 to WLn−1 in response to a row address RA. At the same time, the row selector circuit 130 supplies the dielectric breakdown prevention voltage $V_{DBP}$ to an unselected word line neighboring, or just adjacent to, one side of a selected word line or to unselected word lines neighboring, or just adjacent to, both sides thereof and supplies the pass voltage Vpass to remaining unselected word lines.

The row selector circuit 130 comprises a select signal driver 132 and a row decoder 134. The select signal driver 132 is supplied with the word line voltages Vpgm, Vpass and $V_{DBP}$ from the word line voltage generator circuit 120 at a program operation and generates select signals Sn−1 to S0 applied to corresponding word lines WLn−1 to WL0 in response to a first portion RAi of the bits of the row address RA. The select signal driver 132 activates one select signal according to the received row address RAi and inactivates remaining select signals. The select signal driver 132 drives the activated select signal (e.g., Si) with the program voltage Vpgm, drives one or both inactivated select signals (e.g., Si−1 and Si+1) neighboring, or just adjacent to, one or both sides of the activated select signal Si with the dielectric breakdown prevention voltage $V_{DBP}$, and drives remaining select signals (e.g., S0–Si−2, Si+2–Sn−1) with the pass voltage Vpass.

The row decoder 134 drives the word lines WL0 to WLn−1 in response to both a second portion RAj of bits of the row address RA and the select signals S0 to Sn−1. For example, the input address RAj is an address for selecting a memory block, and the row decoder 134 selects any memory block in response to the input address RAj. The row decoder 134 transfers the select signals S0 to Sn−1 to the word lines WL0 to WLn−1 of the selected memory block, respectively. Accordingly, the program voltage Vpgm is supplied to a selected word line, the dielectric breakdown prevention voltage $V_{DBP}$ is supplied to unselected word lines neighboring, or just adjacent to, one side or both sides of the selected word line, and the pass voltage Vpass is supplied to remaining unselected word lines. For example, when a word line WL0 is selected, the program voltage Vpgm is supplied to the selected word line WL0, and the dielectric breakdown prevention voltage $V_{DBP}$ is supplied to an unselected word line WL1 neighboring, or adjacent to, one side of the selected word line WL0. The pass voltage Vpass is supplied to remaining unselected word lines WL2 to WLn−1. Likewise, when a word line WLn−1 is selected, the program voltage Vpgm is supplied to the selected word line WLn−1, and the dielectric breakdown prevention voltage $V_{DBP}$ is supplied to an unselected word line WLn−2 neighboring, or adjacent to, one side of the selected word line WLn−1. The pass voltage Vpass is supplied to remaining unselected word lines WL0 to WLn−3. Excepting these cases, the dielectric breakdown prevention voltage $V_{DBP}$ is supplied to two unselected word lines just adjacent to both sides of a selected word line.

The page buffer circuit 150 includes page buffers (not shown) each corresponding to bit lines BL0 to BLm. Each of the page buffers senses data from a selected cell during a read operation. The sensed data is output to an i external destination through the column selector circuit 160 and the input/output buffer circuit 170. At a program operation, each page buffer stores data transferred through the input/output buffer circuit 170 and the column selector circuit 160. Each page buffer sets up a corresponding bit line with a first bit line voltage V1 such as a ground voltage, or a second bit line voltage V2 such as a power supply voltage Vcc.

According to the above description, during the program operation, a selected word line (e.g., WLi) is supplied with the program voltage Vpgm, unselected word lines (e.g., WLi−1 and WLi+1) just adjacent to one or both sides of the selected word line WLi are supplied with the dielectric breakdown prevention voltage $V_{DBP}$, and remaining word lines (e.g., WL0 to WLi−2, WLi+2 to WLn−1) are supplied with the pass voltage Vpass. Under this bias condition, the voltage difference between a selected word line and an unselected word line is reduced. Accordingly, it is possible to prevent a dielectric layer between word lines from becoming broken down due to a high voltage difference between the word lines.

Figure 2A:
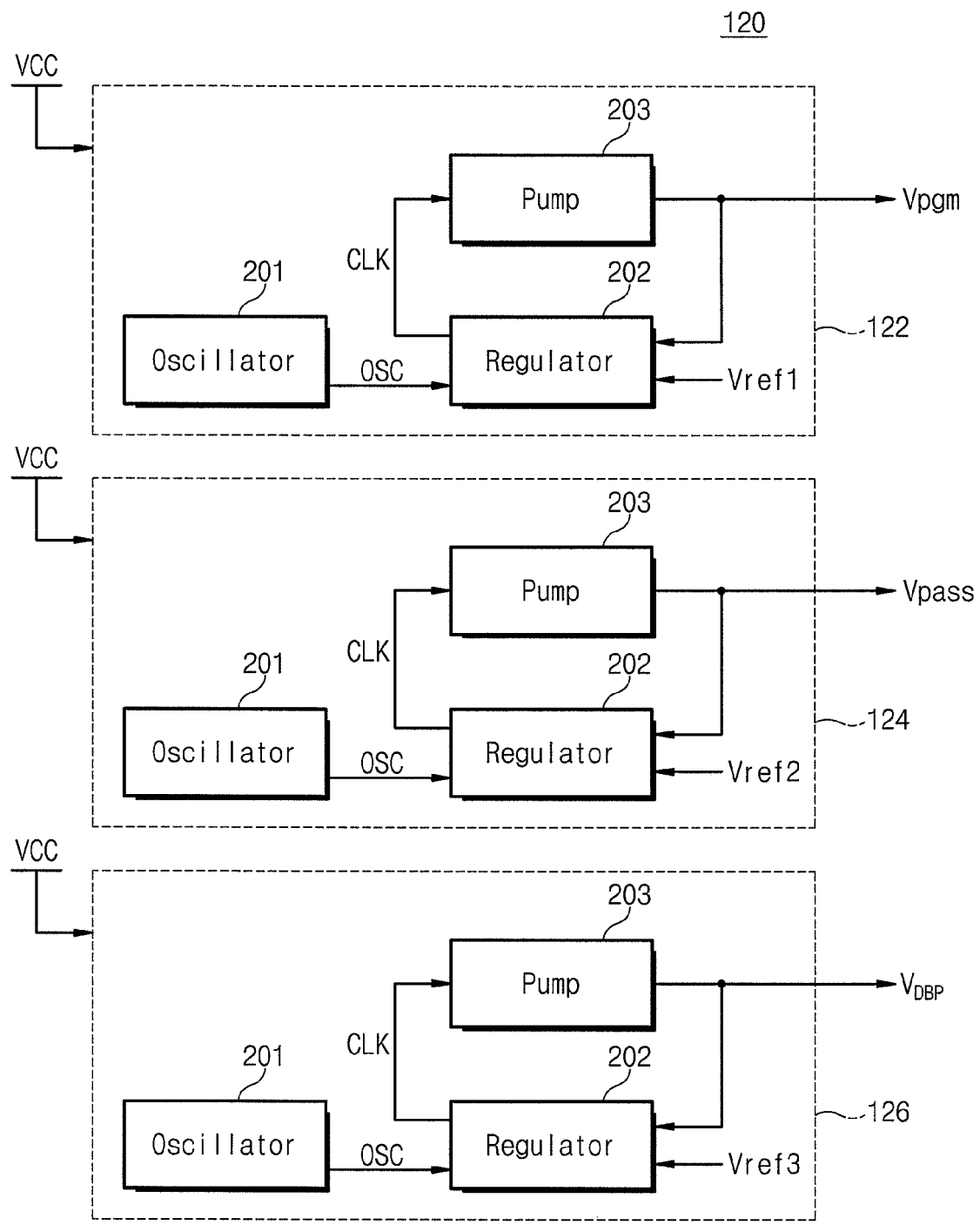
FIG. 2A is a block diagram of the word line voltage generator circuit illustrated in FIG. 1 according to a first embodiment of the present invention.

FIG. 2A is a word line voltage generator circuit 120 illustrated in FIG. 1 according to a first embodiment of the present invention.

Referring to FIG. 2A, the word line voltage generator circuit 120 comprises a first voltage generator 122, a second voltage generator 124 and a third voltage generator 126. The first voltage generator 122 is configured to generate a program voltage Vpgm, the second voltage generator 124 is configured to generate a pass voltage Vpass, and the third voltage generator 126 is configured to generate a dielectric breakdown prevention voltage VDBP. The first to third voltage generators 122, 124 and 126 share similar configurations. That is, as illustrated in FIG. 2A, each of the first to third voltage generators 122, 124 and 126 consists of an oscillator 201, a regulator 202 and a pump 203. The oscillator 201 generates an oscillation signal OSC. The regulator 202 outputs the oscillation signal OSC as a clock signal CLK according to whether an output voltage of the pump 203 is higher than a reference voltage. The pump 203 performs a pumping operation in response to the clock signal CLK. In FIG. 2A, the first to third voltage generators 122, 124 and 126 operate in the same manner except that reference voltages Vref1, Vref2, Vref3 of the regulators 202 are different from each other.

In this embodiment, the dielectric breakdown prevention voltage $V_{DBP}$ is higher than the pass voltage Vpass and lower than the program voltage Vpgm.

Figure 2B:
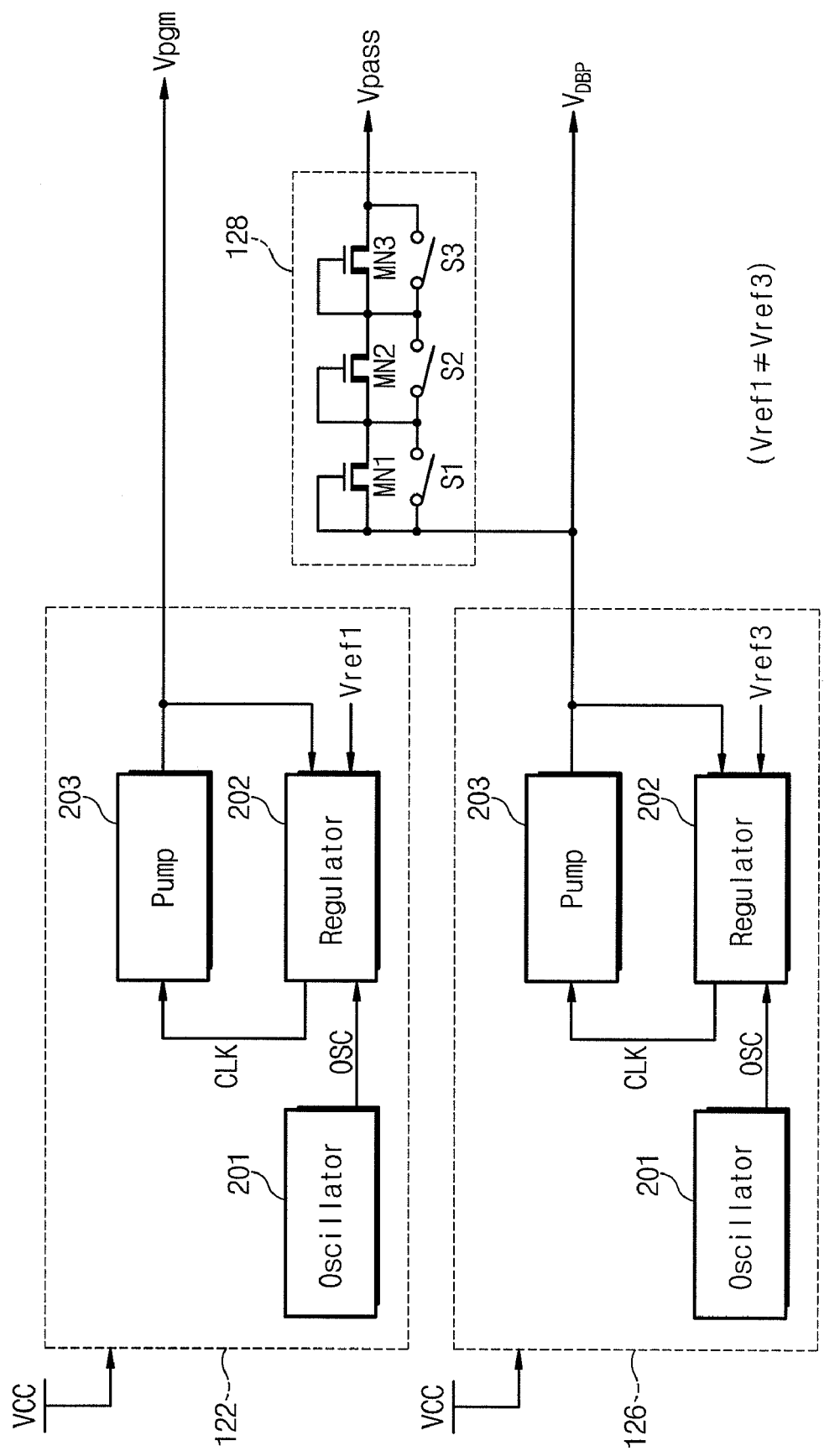
FIG. 2B is a block diagram of the word line voltage generator circuit illustrated in FIG. 1 according to a second embodiment of the present invention.

FIG. 2B is a block diagram of a word line voltage generator circuit 120 illustrated in FIG. 1 according to a second embodiment of the present invention.

The word line voltage generator circuit 120 in FIG. 2B is identical to that in FIG. 2A except that a regulator 128 is used instead of a second voltage generator 124. The regulator 128 receives a dielectric breakdown prevention voltage $V_{DBP}$ generated by a third voltage generator 126 and outputs a pass voltage Vpass. The regulator 128, for example, consists of three NMOS transistors MN1, MN2 and MN3 and three switches S1, S2 and S3. The NMOS transistors MN1, MN2 and MN3 are connected in series between an output of the third voltage generator 126 (or the dielectric breakdown prevention voltage $V_{DBP}$) and the pass voltage Vpass. The switches S1, S2, and S3 are connected in parallel with corresponding NMOS transistors MN1, MN2 and MN3. On-off states of the switches S1, S2, and S3 can be changed according to a required level of the dielectric breakdown prevention voltage $V_{DBP}$. One skilled in the art will recognize that the numbers of transistors and switches in the regulator 128 are not limited to the embodiment disclosed.

Figure 3:
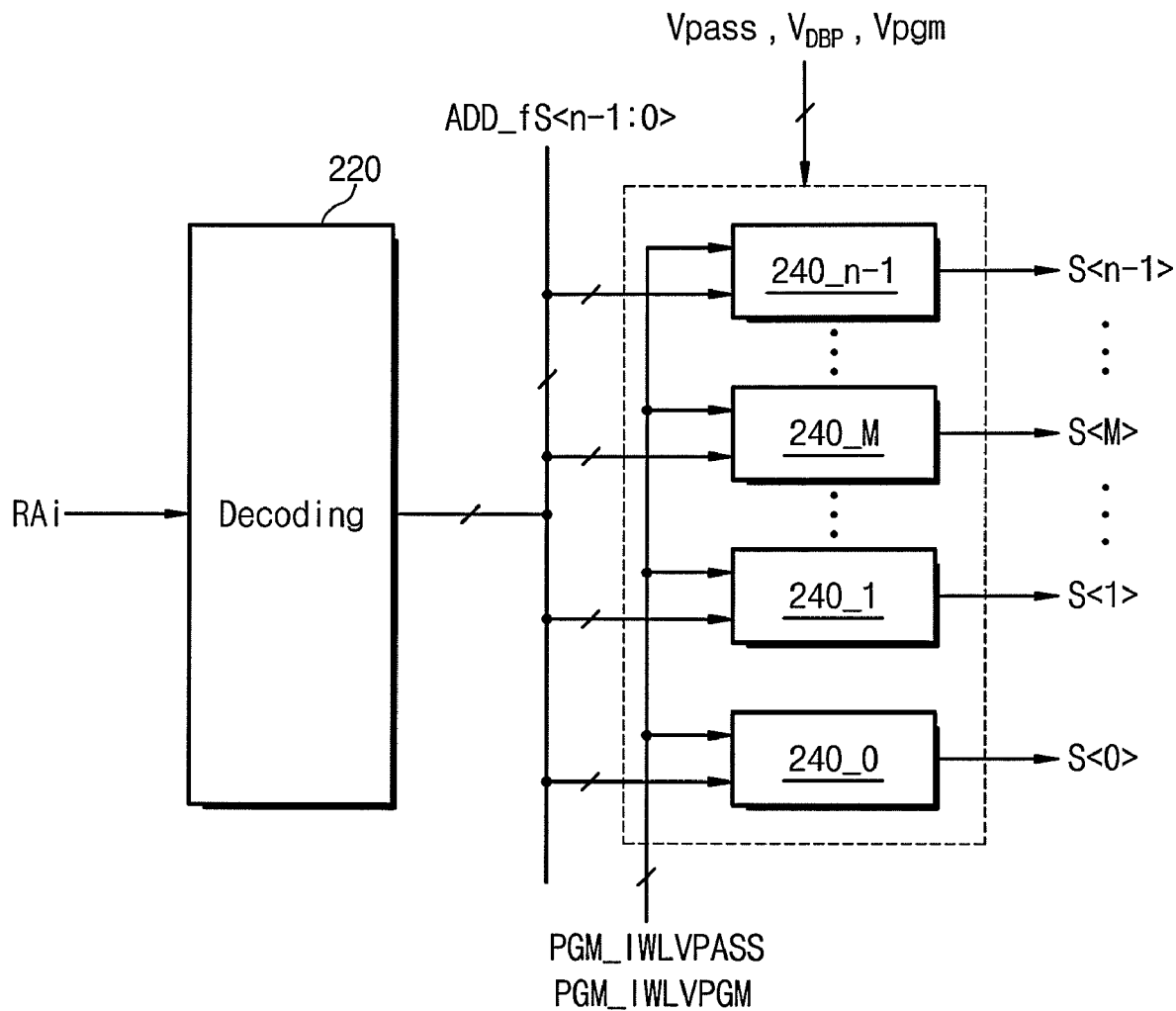
FIG. 3 is a block diagram of the select signal driver illustrated in FIG. 1, in accordance with the present invention.

FIG. 3 is a block diagram of the select signal driver illustrated in FIG. 1. Referring to FIG. 3, the select signal driver 132 comprises a decoding block 220 and a plurality of select signal generator blocks 240_0 to 240_n−1. The decoding block 220 decodes a row address RAi and generates decoded signals ADD_fs<n-1:0> each corresponding to the select signal generator blocks 240_0 to 240_n−1. When the row address RAi is received, the decoding block 220 activates one of the decoded signals ADD_fs<n−1:0>. The voltages Vpass, Vpgm and $V_{DBP}$ from the word line voltage generator circuit 120 are supplied to each of the select signal generator blocks 240_0 to 240_n−1. Each of the select signal generator blocks 240_0 to 240_n−1 operates responsive to control signals PGM_IWLVPASS and PGM_IWLPGM from the control logic 140 in FIG. 1. Each of the select signal generator blocks 240_0 to 240_n−1 receives a part of the decoded signals ADD_fs<n-1:0> and outputs a corresponding select signal. Each of the select signals S<n−1:0> corresponds to each of the decoded signals ADD_fs<n-1:0>, which will be more fully described below.

Figure 4A:
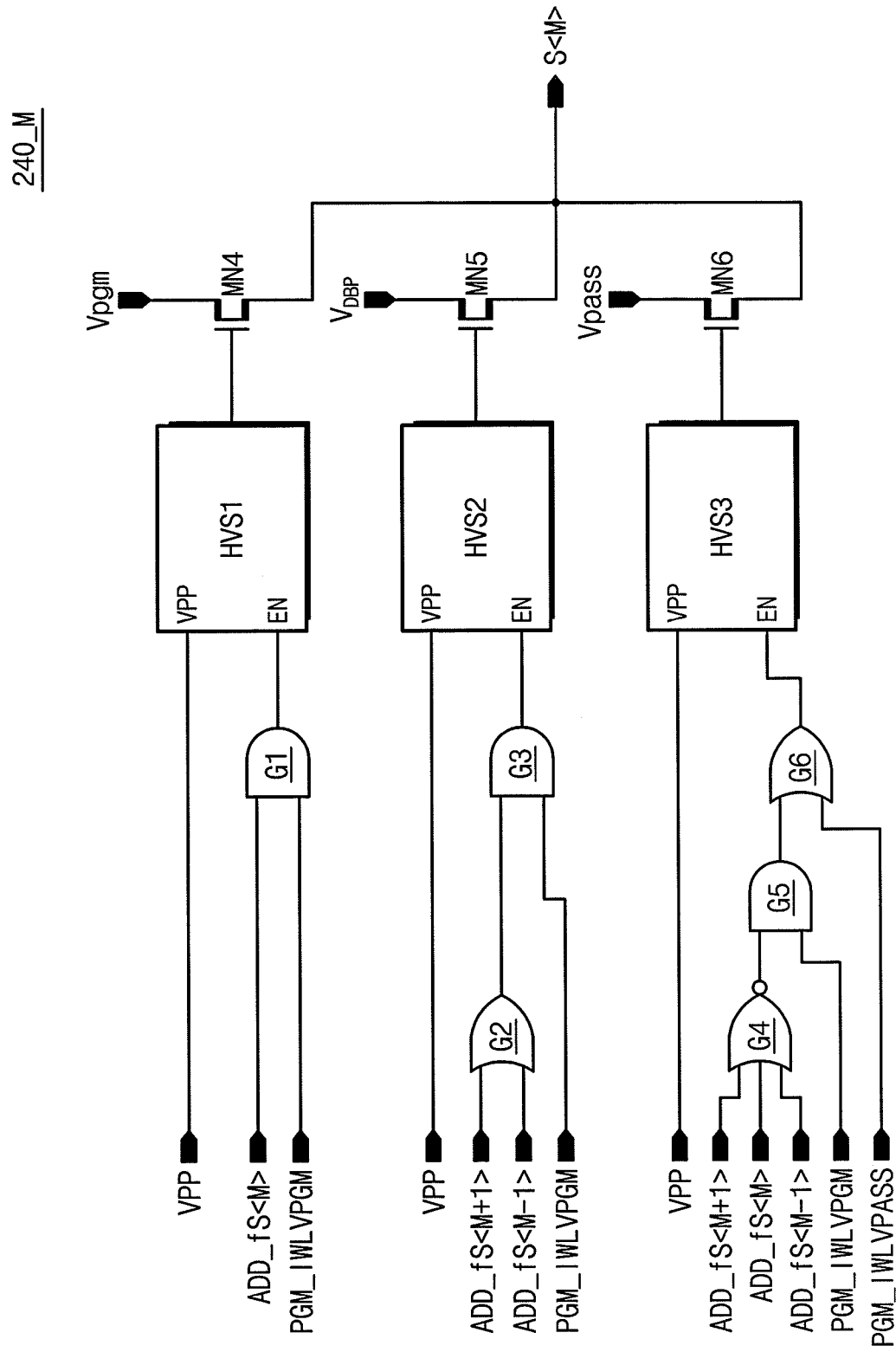
FIGS. 4A, 4B and 4C are block diagrams of a one of the select signal generating blocks illustrated in FIG. 3, in accordance with the present invention.
Figure 4B:
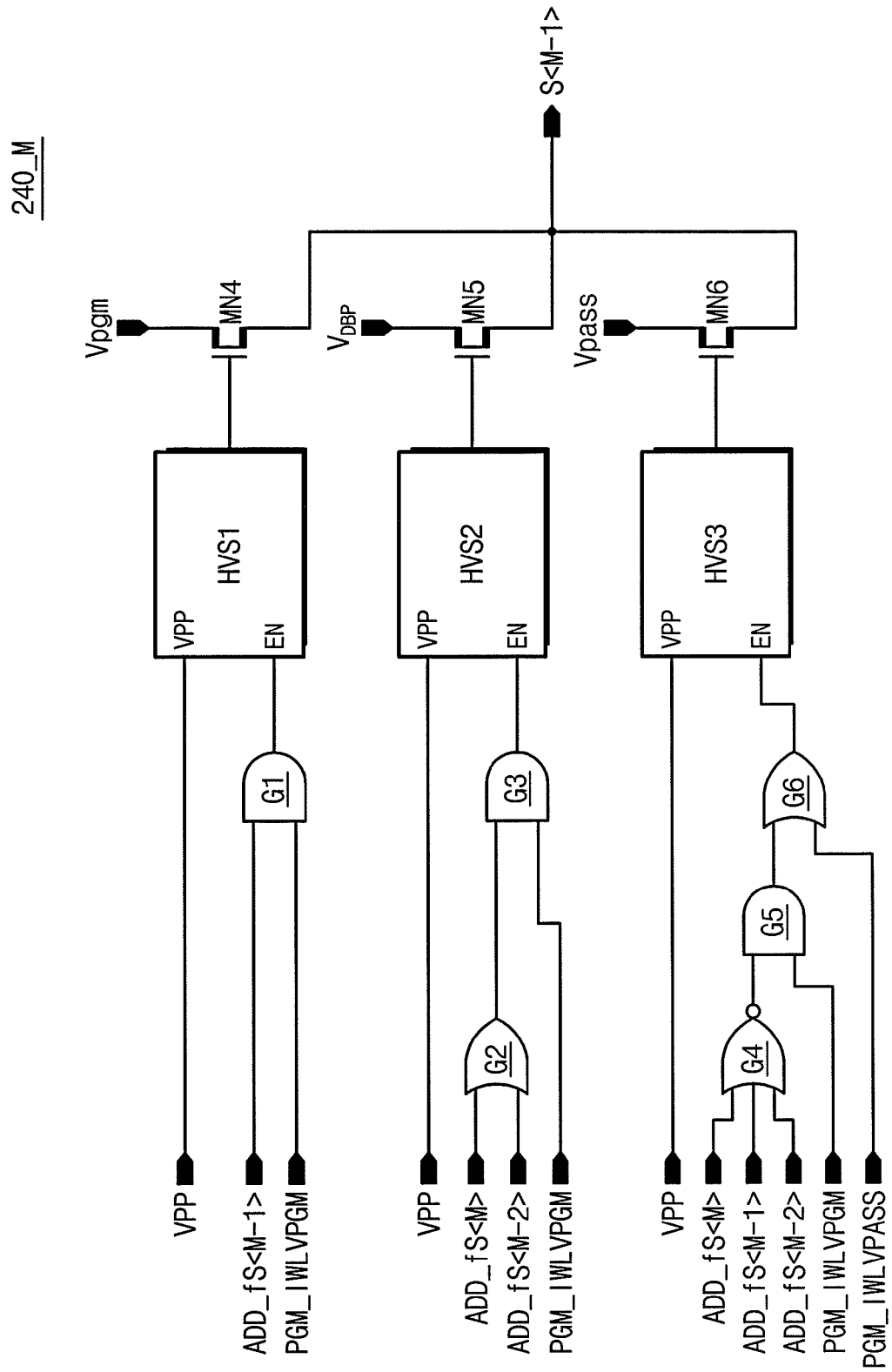
Figure 4C:
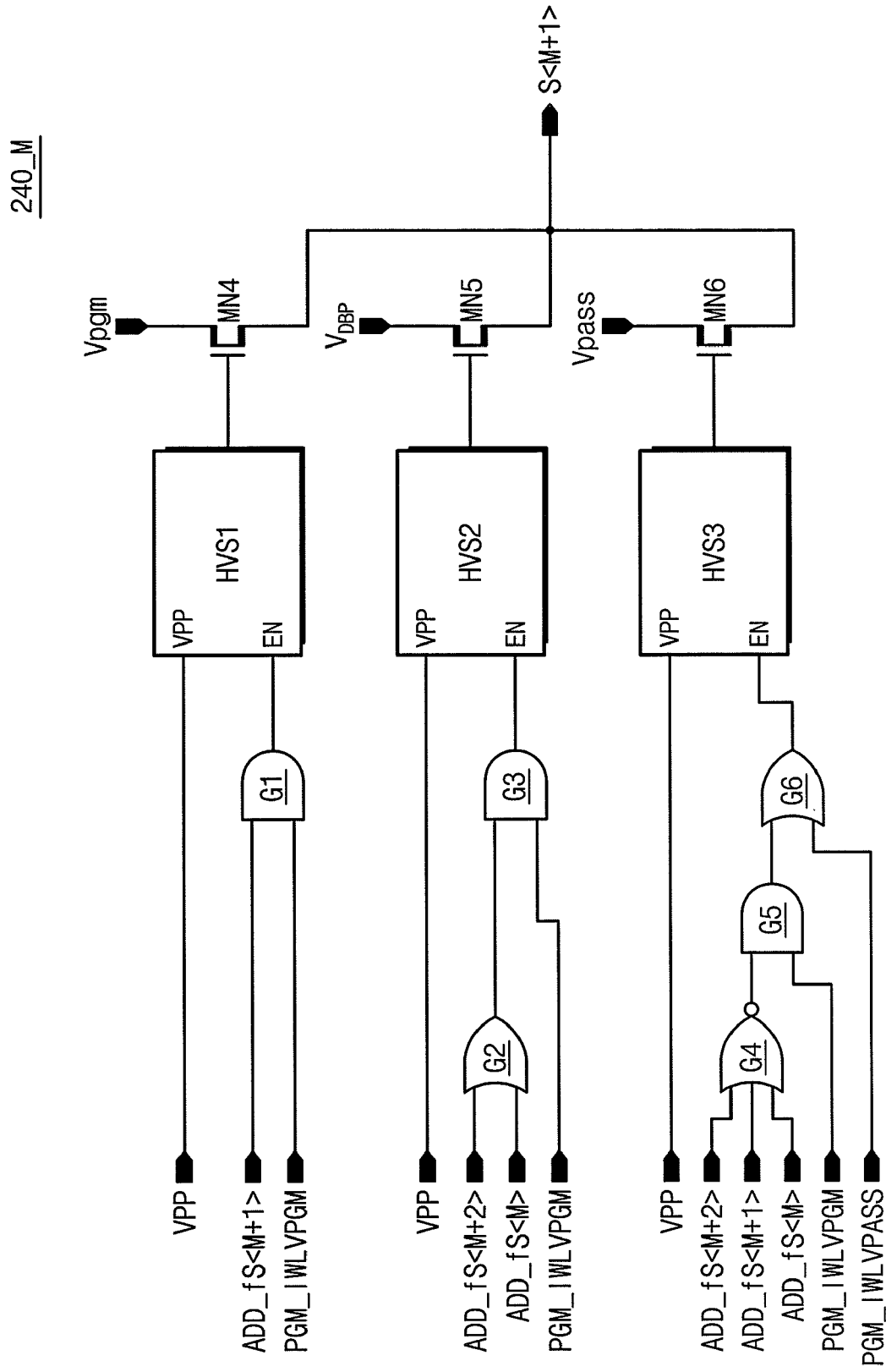

FIGS. 4A, 4B and 4C are block diagrams of the select signal generator blocks illustrated in FIG. 3.

Figure 5:
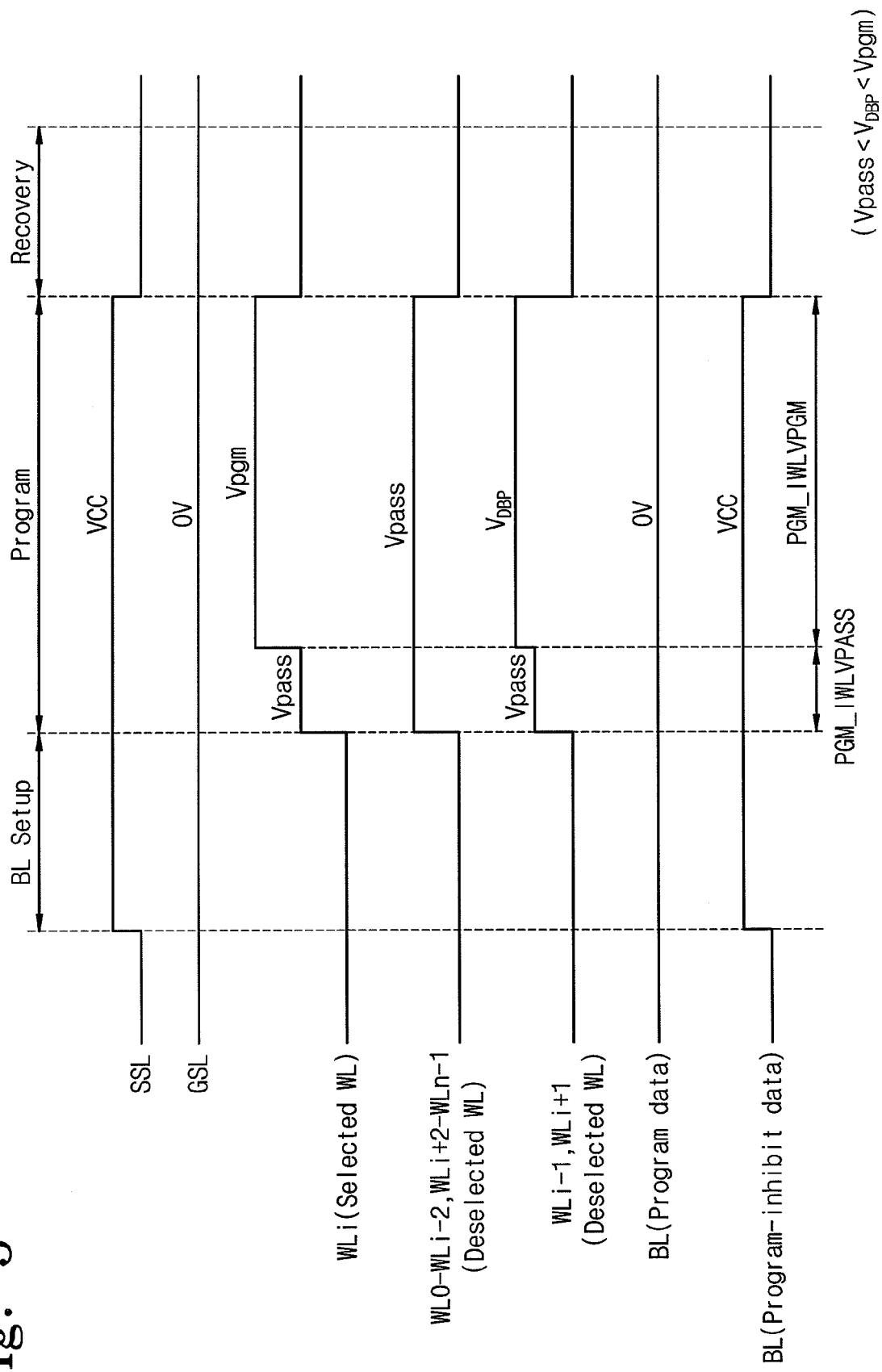
FIG. 5 is a timing diagram for describing a program operation of a flash memory device according to the present invention.

Referring to FIG. 4A, a select signal generator block 240_M comprises three NMOS transistors MN4, MN5 and MN6, high-voltage switches HVS1, HVS2 and HVS3, AND gates G1, G3 and G5, a NOR gate G4, and OR gates G2 and G6, which are connected as illustrated in the drawing. Each of the high-voltage switches HVS1, HVS2 and HVS3 outputs a VPP voltage while an input signal to an EN terminal is activated. The VPP voltage is identical to or higher than (Vpgm+ Vth) (where Vth is a threshold voltage of an NMOS transistor). The control signal PGM_IWLVPGM indicates an interval where the program voltage Vpgm is supplied to a word line, and the control signal PGM_IWLVPASS indicates an interval where the pass voltage Vpass is supplied to a word line. Active intervals of the control signals PGM_IWLVPGM and PGM_IWLVPASS are illustrated in FIG. 5. As illustrated in FIG. 5, the control signal PGM_IWLVPASS is activated during a given time period, and then the control signal PGM_IWLVPGM is activated during a given time period.

In FIG. 4A, the address signal ADD_fs<M> corresponds to a selected word line, an address signal ADD_fs<M+1> corresponds to an unselected word line placed just at an upper side of the selected word line, and the address signal ADD_fs<M−1> corresponds to an unselected word line placed just at a lower side of the selected word line.

A select signal generator block 240_M−1 illustrated in FIG. 4B is identical to that in FIG. 4A except that decoded signals applied to FIG. 4B are different from those applied to FIG. 4A, and description thereof is thus omitted. Likewise, a select signal generator block 240_M+1 illustrated in FIG. 4C is identical to that in FIG. 4A except that decoded signals applied to FIG. 4C are different from those applied to FIG. 4A, and description thereof is thus omitted.

Below, an operation of a select signal driver 132 will be described with reference to accompanying drawings. For ease of description, assume that a row address RAi for selecting an Mth word line is applied to a memory device. According to this assumption, the decoding block 220 in FIG. 3 activates a decoded signal ADD_fs<M>. At this time, remaining decoded signals are inactivated.

Under this condition, if the control signal PGM_IWLV-PASS is activated and the control signal PGM_IWLVPGM is inactivated, a high-level signal is applied to the EN terminal of the high-voltage switch HVS3 in the select signal generator block 240_M, so that the VPP voltage is applied to a gate of the NMOS transistor MN6. That is, an Mth select signal S<M> has the pass voltage Vpass. At this time, the NMOS transistors MN4 and MN5 are turned off because a low-level signal is applied to the EN terminals of the high-voltage switches HVS1 and HVS2 in the select signal generator block 240_M. In accordance with the above description, each of remaining select signal generator blocks outputs a select signal having the pass voltage Vpass. Accordingly, the pass voltage Vpass is supplied to all word lines during an activated interval of the control signal PGM_IWLVPASS.

When the control signal PGM_IWLVPGM is activated and the control signal PGM_IWLVPASS is inactivated, the high-voltage switch HVS1 in the Mth select signal generator block 240_M outputs the VPP voltage based on the decoded signal ADD_fs<M> indicating selection of an Mth word line. This enables the Vpgm voltage to be transferred to the select signal S<M> through the NMOS transistor MN4. That is, the Mth select signal S<M> has the program voltage Vpgm. At the same time, the high-voltage switch HVS2 of the Mth select signal generator block 240_M is disabled by inactivated decoded signals ADD_fs<M+1> and ADD_fs<M−1>.

At the same time, since one ADD_fs<M> of decoded signals ADD_fs<M> and ADD_fs<M−2> applied to the OR gate G2 is activated, a select signal generator block 240_M−1 illustrated in FIG. 4B outputs a select signal S<M−1> having the dielectric breakdown prevention voltage $V_{DBP}$. That is, a high-level signal is applied to the EN terminal of the high-voltage switch HVS2, and the VPP voltage is supplied to a gate of the NMOS transistor MN5. This causes the dielectric breakdown prevention voltage $V_{DBP}$ to be transferred to a select signal terminal S<M−1>. Likewise, since one ADD_fs<M> of decoded signals ADD_fs<M> and ADD_fs<M+2> applied to the OR gate G2 is activated, a select signal generator block 240_M+1 illustrated in FIG. 4C outputs a select signal S<M+1> having the dielectric breakdown prevention voltage $V_{DBP}$. That is, a high-level signal is applied to the EN terminal of the high-voltage switch HVS2, and the VPP voltage is supplied to a gate of the NMOS transistor MN5. This causes the dielectric breakdown prevention voltage $V_{DBP}$ to be transferred to a select signal terminal S<M+1>.

As understood from the above description, when the control signal PGM_IWLVPASS is activated, all select signals S<n−1:0> have the pass voltage Vpass. When the control signal PGM_IWLVPGM is activated, a select signal of a selected word line has the program voltage Vpgm while select signals just adjacent to the selected word line have the dielectric breakdown prevention voltage $V_{DBP}$. Select signals of remaining unselected word lines have the pass voltage Vpass.

Figure 6:
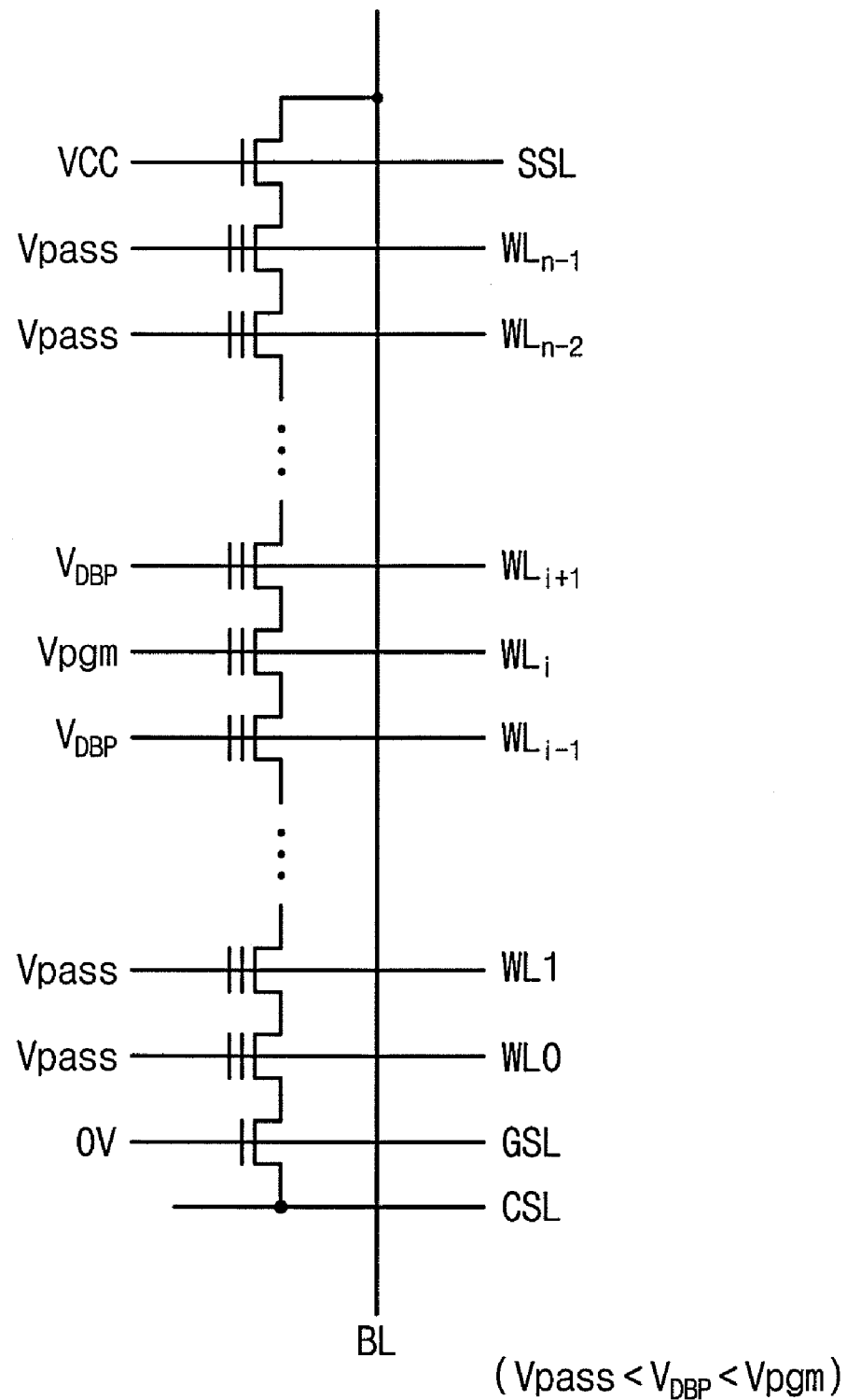
FIG. 6 is a diagram showing a bias condition of word lines according to a program operation of the present invention.

FIG. 5 is a timing diagram for describing a program operation of a flash memory according to the present invention, and FIG. 6 is a diagram showing a bias condition of word lines according to a program operation of the present invention. Below, a program operation of a flash memory according to the present invention will be more fully described with reference to accompanying drawings.

When a program operation commences, program data is loaded onto a page buffer circuit 150 through an input/output buffer circuit 170 and a column selector circuit 160 under the control of the control logic 140. At the same time, a word line voltage generator circuit 120 generates a program voltage Vpgm, a pass voltage Vpass and a dielectric breakdown prevention voltage $V_{DBP}$ according to the control of the control logic 140. As described above, the dielectric breakdown prevention voltage $V_{DBP}$ is lower than the program voltage Vpgm and higher than the pass voltage Vpass. Bit lines BL0 to BLm are set up with a power supply voltage or a ground voltage according to the loaded program data in the page buffer circuit 150, respectively. For example, as illustrated in FIG. 5, if program data of '0' is loaded onto a page buffer, a bit line is set up with the ground voltage. If program data of '1' is loaded onto a page buffer, a bit line is set up with the power supply voltage.

After the bit lines BL0 to BLm are set up, the row selector circuit 130 drives word lines WL0 to WLn−1 with voltages from the word line voltage generator circuit 120 in response to an input row address. For ease of description, it is assumed that a word line WLi in any memory block is selected. According to this assumption, the selected word line WLi is driven with the program voltage Vpgm, unselected word lines WLi−1 and WLi+1 just adjacent to both sides of the selected word line WLi are driven with the dielectric breakdown prevention voltage $V_{DBP}$, and remaining unselected word lines are driven with the pass voltage Vpass. As illustrated in FIG. 5, the selected word line WLi is driven with the pass voltage Vpass during a given time, and then is driven with the program voltage Vpgm. Alternatively, the selected word line WLi can be driven with the dielectric breakdown prevention voltage $V_{DBP}$ during a given time and then driven with the program voltage Vpgm. Memory cells in the selected word line WLi are selectively programmed or program-inhibited under the above bias condition. Afterward, if memory cells in the selected word line WLi are all programmed, as illustrated in FIG. 5, a voltage supplied to each line is discharged to a reference voltage such as a ground voltage.

As described above, it is possible to improve the reliability of a flash memory device by preventing a dielectric layer from becoming broken down due to a voltage difference between a selected word line and an unselected word line.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A NAND type flash memory device comprising:
a flash memory cell array comprising a plurality of non-volatile memory cells arranged in rows and columns, each of the memory cells comprising a memory cell transistor including a charge storage portion adjacent a channel of the memory cell transistor affecting a threshold value of the memory cell transistor, each column including a string memory cell transistors connected in series; and
a row selector circuit configured to select one of the rows and to cause a first voltage to exist on the selected row, a second voltage to exist on at least one row adjacent the selected row and a third voltage to exist on at least one of the remaining rows at a same instant in time during a program operation,
wherein magnitudes of the first, second and third voltages are greater than zero,
wherein the first voltage has a magnitude to allow programming of memory cells arranged along the selected row,
wherein the magnitude of the second voltage is lower than the magnitude of the first voltage and the magnitude of the third voltage is lower than the magnitude of the second voltage,
wherein the at least one row adjacent the selected row is a row that is most directly adjacent the selected row,
wherein the first voltage is a program voltage and the second and third voltages are pass voltages,
wherein the program voltage is sufficient to affect a charge level of memory cell transistors arranged along the selected row and which are memory cell transistors of a string of memory cell transistors which have a program data voltage applied thereto,
wherein the second voltage has a magnitude sufficient to turn on but not program memory cell transistors arranged along the at least one row adjacent the selected row and which are memory cell transistors of a string of memory cell transistors which have a program data voltage applied thereto,
wherein the third voltage has a magnitude sufficient to turn on but not program memory cell transistors arranged along the at least one of the remaining rows and which are memory cell transistors of a string of memory cell transistors which have a program data voltage applied thereto,
wherein the row selector circuit causes the third voltage to exist on at least a majority of rows of those rows operably connected to memory cell transistors of strings of memory cell transistors which include a memory cell transistor operably connected to the selected row, and
wherein the second voltage is caused to exist on first and second rows, each of the first and second rows being immediately adjacent to the selected row, wherein the row selector circuit causes, during a period after a start of a bit line setup period but preceding the same instant, voltages sufficient to turn on but not program memory cell transistors to exist on the selected row, the at least one row adjacent the selected row and the at least one remaining rows.

2. A NAND type flash memory device comprising:
a flash memory cell array comprising a plurality of non-volatile memory cells arranged in rows and columns each of the memory cells comprising a memory cell transistor including a charge storage portion adjacent a channel of the memory cell transistor affecting a threshold value of the memory cell transistor, each column including a string memory cell transistors connected in series; and
a row selector circuit configured to select one of the rows and to cause a first voltage to exist on the selected row, a second voltage to exist on at least one row adjacent the selected row and a third voltage to exist on at least one of the remaining rows at a same instant in time during a program operation,
wherein magnitudes of the first, second and third voltages are greater than zero,
wherein the first voltage has a magnitude to allow programming of memory cells arranged along the selected row,
wherein the magnitude of the second voltage is lower than the magnitude of the first voltage and the magnitude of the third voltage is lower than the magnitude of the second voltage,
wherein the at least one row adjacent the selected row is a row that is most directly adjacent the selected row,
wherein the first voltage is a program voltage and the second and third voltages are pass voltages, wherein the program voltage is sufficient to affect a charge level of memory cell transistors arranged along the selected row and which are memory cell transistors of a string of memory cell transistors which have a program data voltage applied thereto, wherein the second voltage has a magnitude sufficient to turn on but not program memory cell transistors arranged along the at least one row adjacent the selected row and which are memory cell transistors of a string of memory cell transistors which have a program data voltage applied thereto, wherein the third voltage has a magnitude sufficient to turn on but not program memory cell transistors arranged along the at least one of the remaining rows and which are memory cell transistors of a string of memory cell transistors which have a program data voltage applied thereto, wherein the row selector circuit is configured to apply, during a bit line setup period preceding a program operation, a reference voltage to the selected row and to at least a majority of rows operably connected to strings of memory cell transistors which include a memory cell transistor operably connected to the selected row, and wherein the row selector circuit is configured to apply, during a period after the bit line setup period but preceding the same instant, a same voltage to the selected row and to at least a majority of rows operably connected to strings of memory cell transistors which include a memory cell transistor operably connected to the selected row.

3. The flash memory device of claim 2, wherein the same voltage is the third voltage.

4. The flash memory device of claim 3, wherein the row selector circuit causes the third voltage on the at least one row adjacent the selected row to increase to the second voltage.

5. The flash memory device of claim 3, wherein the row selector circuit causes the third voltage on the at least one row adjacent the selected row to increase to the second voltage concurrently with causing the third voltage on the selected row to increase to the first voltage.

6. A flash memory device comprising:
a flash memory cell array having a plurality of non-volatile memory cells arranged in rows and columns; and
a row selector circuit configured to select one of the rows and to cause a first voltage to exist on the selected row, a second voltage to exist on at least one row adjacent the selected row and a third voltage to exist on at least one of the remaining rows at a same instant in time during a program operation,
wherein magnitudes of the first, second and third voltages are greater than zero,
the first voltage has a magnitude to allow programming of memory cells arranged along the selected row, and
the magnitude of the second voltage is lower than the magnitude of first voltage and the magnitude of the third voltage is lower than the magnitude of the second voltage,
wherein the at least one row adjacent the selected row is a row that is most directly adjacent the selected row, and
wherein the row selector circuit causes the third voltage to exist on at least the selected row, the at least one row adjacent the selected row, and the at least one of the remaining rows, during a period after a start of a bit line setup period but preceding the same instant.

7. A flash memory device comprising:
a flash memory cell array having a plurality of non-volatile memory cells arranged in rows and columns; and
a row selector circuit configured to select one of the rows and to cause a first voltage to exist on the selected row, a second voltage to exist on at least one row adjacent the selected row and a third voltage to exist on at least one of the remaining rows at a same instant in time during a program operation,
wherein magnitudes of the first, second and third voltages are greater than zero,
the first voltage has a magnitude to allow programming of memory cells arranged along the selected row, and
the magnitude of the second voltage is lower than the magnitude of first voltage and the magnitude of the third voltage is lower than the magnitude of the second voltage,
wherein the at least one row adjacent the selected row is a row that is most directly adjacent the selected row,
wherein the row selector circuit is configured to apply, during a bit line setup period preceding a program operation, a reference voltage to the selected row, the at least one row adjacent the selected row, and the at least one of the remaining rows, and
wherein the row selector circuit is configured to apply, during a period after the start of the bit line setup period but preceding the same instant, a same voltage to the selected row, the at least one row adjacent the selected row, and the at least one of the remaining rows.

8. The flash memory device of claim 7, wherein the same voltage is the third voltage.

9. The flash memory device of claim 8, wherein the row selector circuit causes the third voltage on the at least one row adjacent the selected row to increase to the second voltage.

10. The flash memory device of claim 9, wherein the row selector circuit causes the third voltage on the at least one row adjacent the selected row to increase to the second voltage substantially concurrently with causing the third voltage on the selected row to increase to the first voltage.

11. A flash memory device comprising:
a flash memory cell array having a plurality of non-volatile memory cells arranged in rows and columns; and
a row selector circuit configured to select one of the rows and to cause a first voltage to exist on the selected row, a second voltage to exist on at least one row adjacent the selected row and a third voltage to exist on at least one of the remaining rows at a same instant in time during a program operation,
wherein magnitudes of the first, second and third voltages are greater than zero,
the first voltage has a magnitude to allow programming of memory cells arranged along the selected row, and
the magnitude of the second voltage is lower than the magnitude of first voltage and the magnitude of the third voltage is lower than the magnitude of the second voltage,
wherein the at least one row adjacent the selected row is a row that is most directly adjacent the selected row, and
wherein the row selector circuit causes the third voltage on the at least one row adjacent the selected row to increase to the second voltage substantially concurrently with causing the third voltage on the selected row to increase to the first voltage.

12. A flash memory device comprising:
a flash memory cell array having a plurality of non-volatile memory cells arranged in rows and columns; and
a row selector circuit configured to select one of the rows and to cause a first voltage to exist on the selected row, a second voltage to exist on at least one row adjacent the selected row and a third voltage to exist on at least one of the remaining rows at a same instant in time during a program operation, wherein magnitudes of the first, second and third voltages are greater than zero, the first voltage has a magnitude to allow programming of memory cells arranged along the selected row, and the magnitude of the second voltage is lower than the magnitude of first voltage and the magnitude of the third voltage is lower than the magnitude of the second voltage, and wherein the at least one row adjacent the selected row is a row that is most directly adjacent the selected row, the flash memory device further comprising:

a word line voltage generator circuit having outputs of fourth, fifth and sixth voltages;

wherein the row selector circuit causes the first voltage to exist on the selected row by connecting the output of the fourth voltage of the word line voltage generator circuit to the selected row, causes the second voltage to exist on the at least one row adjacent the selected row by connecting the output of the fifth voltage of the word line voltage generator circuit to the at least one row adjacent to the selected row, and causes the third voltage to exist on the at least one of the remaining rows by connecting the output of the sixth voltage of the word line voltage generator circuit to the at least one of the remaining rows.

13. The flash memory device of claim 12, wherein the fourth, fifth and sixth voltages have substantially the same magnitude as the first, second and third voltages, respectively.

* * * * *